United States Patent
Kim et al.

(10) Patent No.: US 10,825,874 B2
(45) Date of Patent: Nov. 3, 2020

(54) DISPLAY DEVICE AND METHOD OF MANUFACTURING THE SAME

(71) Applicant: SAMSUNG DISPLAY CO., LTD., Yongin-si (KR)

(72) Inventors: Jaehyun Kim, Yongin-si (KR); Dalho Kim, Yongin-si (KR); Jongwoo Kim, Yongin-si (KR); Hyun Kim, Yongin-si (KR); Changwoo Shim, Yongin-si (KR); Sanghun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 298 days.

(21) Appl. No.: 14/951,355

(22) Filed: Nov. 24, 2015

(65) Prior Publication Data
US 2016/0365393 A1 Dec. 15, 2016

(30) Foreign Application Priority Data
Jun. 11, 2015 (KR) .................. 10-2015-0082566

(51) Int. Cl.
*H01L 33/58* (2010.01)
*H01L 27/32* (2006.01)
(Continued)

(52) U.S. Cl.
CPC ........ *H01L 27/3232* (2013.01); *H01L 27/322* (2013.01); *H01L 27/3244* (2013.01);
(Continued)

(58) Field of Classification Search
CPC ......... G02B 5/20; G02B 5/201; H01L 27/322; H01L 27/1255; H01L 51/5246;
(Continued)

(56) References Cited

U.S. PATENT DOCUMENTS

| | | | |
|---|---|---|---|
| 6,624,860 B1 * | 9/2003 | Narutaki ................ | G02B 5/201 349/106 |
| 2007/0238227 A1 * | 10/2007 | Jun ..................... | H01L 27/1255 438/149 |

(Continued)

FOREIGN PATENT DOCUMENTS

| EP | 2 824 709 A2 | 1/2014 |
|---|---|---|
| KR | 10-2007-0049007 A | 5/2007 |

(Continued)

OTHER PUBLICATIONS

EPO Search Report dated Oct. 25, 2016, for corresponding European Patent Application No. 16174092.3, (8 pages).

*Primary Examiner* — Steven H Loke
*Assistant Examiner* — Samuel Park
(74) *Attorney, Agent, or Firm* — Lewis Roca Rothgerber Christie LLP

(57) ABSTRACT

A display device has a first region and a second region, the display device including a substrate, a display portion on the substrate, a first base layer on the display portion and corresponding to the first region, a plurality of first optical functional particles inside the first base layer at a first concentration and having chromatic color, a second base layer on the display portion and corresponding to the second region, and a plurality of second optical functional particles inside the second base layer at a second concentration that is higher than the first concentration and having chromatic color.

15 Claims, 13 Drawing Sheets

(51) Int. Cl.
*H01L 51/00* (2006.01)
*H01L 51/52* (2006.01)

(52) U.S. Cl.
CPC ...... *H01L 51/0097* (2013.01); *H01L 51/5284* (2013.01); *H01L 2251/5338* (2013.01); *Y02E 10/549* (2013.01)

(58) Field of Classification Search
CPC ............. H01L 27/3232; H01L 51/5284; H01L 27/3244; H01L 51/0097; H01L 2251/5338; Y02E 10/549
See application file for complete search history.

(56) References Cited

U.S. PATENT DOCUMENTS

| | | | | |
|---|---|---|---|---|
| 2008/0111474 | A1* | 5/2008 | Sung | H01L 27/322 313/504 |
| 2008/0238303 | A1* | 10/2008 | Lee | H01L 51/5246 313/504 |
| 2010/0007270 | A1 | 1/2010 | Suh | |
| 2011/0062475 | A1 | 3/2011 | Cho | |
| 2011/0228514 | A1* | 9/2011 | Tong | H01L 25/0753 362/84 |
| 2012/0300131 | A1* | 11/2012 | Takata | G02B 5/20 348/725 |
| 2013/0059155 | A1 | 3/2013 | Choi et al. | |
| 2014/0168090 | A1* | 6/2014 | Aaltonen et al. | H01L 25/0753 362/84 |
| 2014/0367711 | A1* | 12/2014 | Bibl | H01L 24/24 257/89 |
| 2015/0014655 | A1 | 1/2015 | Yun et al. | |
| 2015/0144919 | A1 | 5/2015 | Matsumoto et al. | |

FOREIGN PATENT DOCUMENTS

| | | |
|---|---|---|
| KR | 10-2010-0007265 A | 1/2010 |
| KR | 10-2011-0029311 A | 3/2011 |

\* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2015-0082566, filed on Jun. 11, 2015, in the Korean Intellectual Property Office, the disclosure of which is incorporated herein in its entirety by reference.

BACKGROUND

1. Field

One or more exemplary embodiments relate to a display device and a method of manufacturing the same.

2. Description of the Related Art

As information-oriented technology develops, the market of display devices, which may be used as a medium between users and information, increases. Accordingly, use of flat panel display devices, such as a liquid crystal display (LCD), an organic light-emitting diode (OLED), or a plasma display panel (PDP), etc. increases.

For user convenience, image quality characteristics of a display device may be improved. Meanwhile, due to recent use of a display device under various environments and in various conditions, and due to a manufacturing process characteristic of a display device, improvement of image quality of a display device has limitations.

SUMMARY

One or more exemplary embodiments include a display device and a method of manufacturing the same.

According to one or more exemplary embodiments, a display device has a first region and a second region, the display device including a substrate, a display portion on the substrate, a first base layer on the display portion and corresponding to the first region, a plurality of first optical functional particles inside the first base layer at a first concentration and having chromatic color, a second base layer on the display portion and corresponding to the second region, and a plurality of second optical functional particles inside the second base layer at a second concentration that is higher than the first concentration and having chromatic color.

The second region may correspond to a bent region.

An upper surface of the second region may be spaced from an extension line of an upper surface of the first region.

At least a portion of an upper surface of the first region may be flat.

At least a portion of an upper surface of the second region may be inclined or curved.

The second region may contact the first region.

The second region may be at both sides of the first region with the first region therebetween.

At least one of the first base layer or the second base layer may include an insulating material.

The first base layer and the second base layer may be integrally formed with each other and may include a same material.

The first optical functional particles or the second optical functional particles may include a chromatic material.

The first optical functional particles or the second optical functional particles may include a pigment.

The display device may further include an optical reflection reduction member adjoining at least one of the first base layer or the second base layer.

The first base layer or the second base layer may cover the optical reflection reduction member.

The optical reflection reduction member may include a black matrix-forming material.

The optical reflection reduction member may be patterned as a plurality of shapes spaced from each other, and the display portion may be configured to generate light emitted via a space between the plurality of shapes of the optical reflection reduction member.

The display device may further include a first insulating layer between the display portion and at least one of the first base layer or the second base layer.

The display device may further include a second insulating layer at an upper portion of at least one of the first base layer or the second base layer.

The substrate may have flexibility.

The display portion may include a first electrode, a second electrode, and an interlayer including an emission layer between the first electrode and the second electrode.

The display device may further include a capping layer between the display portion and at least one of the first base layer or the second base layer.

The display device may further include a protection layer between the capping layer and at least one of the first base layer or the second base layer.

A display device according to an exemplary embodiment may improve an image quality characteristic.

Also, a display device according to an exemplary embodiment may have a reduced thickness.

The effect of exemplary embodiments may be derived from content described below with reference to the drawings besides the above-described content, of course.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION

Figure 1:
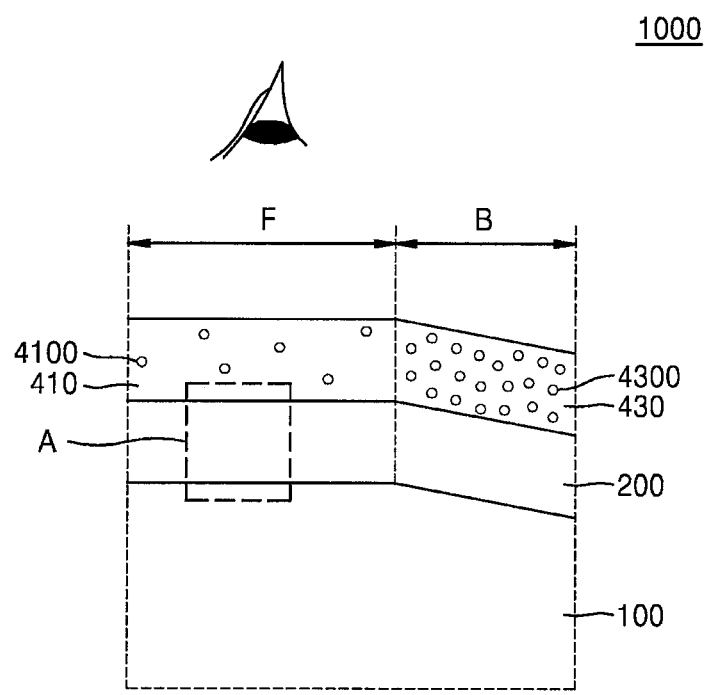
FIG. 1 is a cross-sectional view illustrating a portion of a display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be on one integrated circuit (IC) chip or on separate IC chips. Further, the various components of these devices may be implemented on a flexible printed circuit film, a tape carrier package (TCP), a printed circuit board (PCB), or on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When a certain embodiment may be implemented differently, a process order may be performed differently from the described order. For example, two consecutively described processes may be performed substantially at the same time or performed in an order opposite to the described order.

Figure 2:
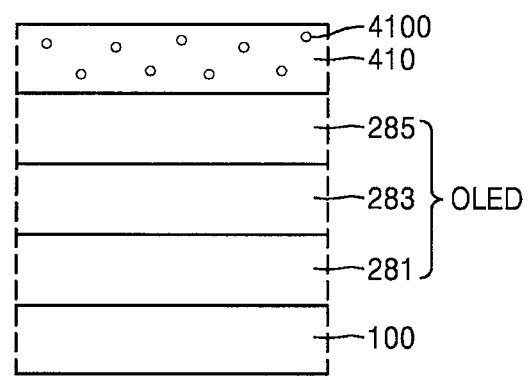
FIG. 2 is a schematic enlarged cross-sectional view illustrating the region A of FIG. 1.

FIG. 1 is a cross-sectional view illustrating a portion of a display device 1000 according to an exemplary embodiment, and FIG. 2 is a schematic enlarged cross-sectional view illustrating the region A of FIG. 1.

As illustrated in FIG. 1, the display device 1000 according to the present embodiment may include the first region F, where visible light that a user may recognize is generated, and may also include the second region B that does not overlap the first region F. Also, the display device 1000 according to the present embodiment may include a substrate 100, a display portion 200, a first base layer 410, first optical functional particles 4100, a second base layer 430, and second optical functional particles 4300.

The substrate 100 may include various materials. For example, the substrate 100 may include a glass material and/or other insulating materials, and/or may include a metallic thin film. In another exemplary embodiment, the substrate 100 may include a flexible material. For example, the substrate 100 may include an organic material. In another exemplary embodiment, the substrate 100 may include at least one of polyimide, a silicon-based polymer, polyurethane, polyurethane acrylate, an acrylate polymer, and/or acrylate terpolymer, and the silicon-based polymer may include, for example, polydimethylsiloxane (PDMS), hexamethyldisiloxane (HMDSO), etc.

The display device 1000 according to the present embodiment may allow the substrate 100 to be elongated or stretched two-dimensionally by forming the substrate 100 to be flexible. In another exemplary embodiment, the substrate 100 may include a material having a Poisson's ratio of 0.4 or more. The Poisson's ratio refers to a ratio by which a length of one side extending in a first direction is reduced when a length of another side extending in a second direction, which crosses the first direction, is drawn and extended/stretched. By forming the substrate 100 using a material having Poisson's ratio that is 0.4 or more, that is, by allowing the substrate 100 to have a characteristic of easy elongation, flexibility of the substrate 100 is improved, and the substrate 100 may have a bent region. Accordingly, the display device 1000 of the present embodiment may include a bent region.

Although not shown, a lower portion of the substrate 100 may have a shape similar to an upper portion. That is, the lower portion of the substrate 100 may have a shape that corresponds to the upper portion thereof. In another embodiment, the lower portion of the substrate 100 may be different from the upper portion of the substrate 100. For example, the lower portion of the substrate 100 may have a flat surface.

The display portion 200 is on the substrate 100, and is configured to generate visible light that a user may recognize. The display portion 200 may include various devices, such as, for example, an organic light-emitting device (OLED), a liquid crystal display device, etc. In the display device 1000 according to the present embodiment, the display portion 200 has an OLED.

As shown in FIG. 2, the OLED may include a first electrode 281, an interlayer 283 including an organic emission layer, and a second electrode 285. A hole and an electron injected from the first electrode 281 and the second electrode 285 of the OLED, respectively, may recombine in the organic emission layer of the interlayer 283 to emit light.

The first electrode 281 and the second electrode 285 may include various conductive materials. In another exemplary embodiment, the first electrode 281 and/or the second electrode 285 may include a light transmission material or a reflective material. The light transmission material may include ITO, IZO, or $In_2O_3$, and the reflective material may include Ag, Mg, Al, Pt, Pd, Au, Ni, Nd, Ir, Cr, and/or a compound thereof, etc.

The interlayer 283 may be formed between the first electrode 281 and the second electrode 285, and may include the organic emission layer. In another exemplary embodiment, the interlayer 283 may include the organic emission layer, and may additionally include a hole injection layer (HIL), a hole transport layer, an electron transport layer, and/or an electron injection layer. However, the present embodiment is not limited thereto, and the interlayer 283 may include the organic emission layer and various other functional layers.

The first base layer 410 and the second base layer 430 are on the display portion 200. The first optical functional particles 4100 and the second optical functional particles 4300 are provided inside the first base layer 410 and the second base layer 430, respectively.

One or more layers, such as, for example, an insulating layer or a conductive layer, may be between the display portion 200 and the first base layer 410, or may be between the display portion 200 and the second base layer 430.

The first base layer 410 may be at a position corresponding to the first region F, and the second base layer 430 may be at a position corresponding to the second region B. The first base layer 410 may include various materials, such as, for example, an insulating material. In other exemplary embodiments, the first base layer 410 may include an organic material, or may have liquidity that is formable by an ink-jet process.

The second base layer 430 may include various materials, such as, for example, an insulating material. In other exemplary embodiments, the second base layer 430 may include an organic material, or may have liquidity that is formable by an ink-jet process.

In another exemplary embodiment, the first base layer 410 or the second base layer 430 may include a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB). In other exemplary embodiments, the first base layer 410 and the second base layer 430 may include the same material, and/or may be integrally formed with each other.

The first optical functional particles 4100 are located inside the first base layer 410, are provided in plural, and have chromatic color. Chromatic color of the first optical functional particles 4100 may be variously determined. For example, the first optical functional particles 4100 may have one of red, green, and blue colors, which may correspond to colors of a color filter. In another exemplary embodiment, one of the first optical functional particles 4100 may have a color that is different from the color of another one of the first optical functional particles 4100.

The second optical functional particles 4300 are located inside the second base layer 430, are provided in plural, and have chromatic color. Chromatic color of the second optical functional particles 4300 may be variously determined. For example, the second optical functional particles 4300 may have one of red, green, and blue colors, which may correspond to colors of a color filter. In another exemplary embodiment, one of the second optical functional particles 4300 may have a color that is different from the color of another one of the second optical functional particles 4300.

In another exemplary embodiment, the first optical functional particles 4100 and the second optical functional particles 4300 may have the same color. The first optical functional particles 4100 or the second optical functional particles 4300 may include various materials, and may include a chromatic color material of a color filter (e.g., a chromatic material corresponding to a color of a color filter). In another exemplary embodiment, the first optical functional particles 4100 or the second optical functional particles 4300 may include a pigment. In another exemplary embodiment, the first optical functional particles 4100 and/or the second optical functional particles 4300 may include a pigment having a size of about 25 nm to about 40 nm.

The first optical functional particles 4100 and the second optical functional particles 4300 may be included in the first base layer 410 and the second base layer 430 at different concentrations, respectively. The plurality of first optical functional particles 4100 may be of a first concentration, and the plurality of second optical functional particles 4300 may be of a second concentration, which may be higher than the first concentration.

In another exemplary embodiment, the first optical function particles 4100 and the first base layer 410 may be formed by using an ink-jet process, and the second optical function particles 4300 and the second base layer 430 may be formed by using the ink-jet process. For example, a material where the first base layer 410 and the first optical functional particles 4100 are mixed may be on the display portion 200 by an ink-jet process, and the second optical functional particles 4300 and the second base layer 430 may be formed by the same process. The concentration of the first optical functional particles 4100 inside the first base layer 410, and the concentration of the second optical functional particles 4300 inside the second base layer 430, may be adjusted by using an ink-jet process. That is, a size, an amount of drop, and a pitch of the first optical functional particles 4100 and of the second optical functional particles 4300 during the ink-jet process may be adjusted. Therefore, the display device 1000 according to the present embodiment may adjust the size and/or the concentration of the first optical functional particles 4100 and of the second optical functional particles 4300 for each position by changing a process recipe for each ink-jet head in the ink-jet process.

The display device 1000 according to the present embodiment may improve image quality through use of the first optical functional particles 4100 and use of the second optical functional particles 4300. For example, reflection of incident external light may be reduced, and the brightness of visible light generated from the display portion 200 may be improved. That is, the display device 1000 may have a different optical effect by changing the first concentration of the first optical functional particles 4100 and the second concentration of the second optical functional particles 4300 depending on characteristics of the first region F and of the second region B. By adjusting these concentrations, user visibility/image perception may improve.

Also, contrast of the display device 1000 may be improved via design of the first optical functional particles 4100 and the second optical functional particles 4300, and the display device 1000 may omit a polarization member (e.g., may omit a polarization film, etc.), thereby enabling the overall thickness of the display device 1000 to be reduced, and thereby improving the flexibility of the display device 1000 so that a bent region may be easily formed.

A general polarization member has a thickness of several micrometers to several hundred micrometers, and is formed to be relatively thick, thus creating difficulty in folding and bending a general display device. When a polarization member is attached by an adhesive, and when the adhesive is cured at low temperature of about 20 degrees below zero, the modulus of the adhesive may increase during a folding operation, causing the adhesive to become stiff. Consequently, the adhesive may apply pressure to the display device, and may cause a dark spot. The display device 1000 according to the present embodiment may reduce or resolve this type of problem by omitting the polarization member.

Also, the first base layer 410 and the second base layer 430 may protect the display portion 200 from an external foreign substance, air, or moisture, and may effectively encapsulate an OLED that would be sensitive to the air or moisture. Accordingly, durability of the display device 1000 may be improved. Also, members for encapsulating the display portion 200 may be omitted or reduced, so that the overall thickness of the display device 1000 may be reduced, and so that a manufacturing process of the display device 1000 may be simplified.

In another exemplary embodiment, the first region F may include a central region that a user recognizes. That is, for example, the first region F may include the central region of the display device 1000. Also, the second region B may extend away from the central region of the first region F of the display device 1000, or may be separated from the first region F by a given distance.

Image quality uniformity of the first and second regions F and B may be improved by allowing the concentration of the second optical functional particles 4300 to be higher than the concentration of the first optical functional particles 4100, thus improving optical efficiency of the second region B, which may otherwise be lower than the optical efficiency of the central region of the display device 1000 included in the first region F. That is, in another exemplary embodiment, the second region B may include a region that is bent in a direction away from the user. For example, assuming that the eye illustrated in FIG. 1 corresponds to the user's view/viewing position, the display device 1000 may be formed such that a region that is bent in a direction away from the user corresponds to the second region B. However, a direction in which the display device 1000 is bent is not limited to the exemplary embodiment illustrated in the drawing, and according to another exemplary embodiment, the display device 1000 may be bent in a direction toward the user. In this case, the concentration of an optical functional particles corresponding to a region that is bent toward the user may be lower than the concentration of an optical functional particles of the other regions.

In another exemplary embodiment, the second region B may include a region that is bent away from an intended viewpoint of the user, and the upper surface of the second region B may be spaced from an extension line of the upper surface of the first region F by a given interval.

In another exemplary embodiment, at least a portion of the upper surface of the first region F may be flat, or the entire upper surface of the first region F may be flat, as illustrated in FIG. 1. Further, at least one region of the upper surface of the second region B may have an inclined surface. For example, as illustrated in FIG. 1, at least a portion of the second region B may be sloped. Also, at least a portion of the upper surface of the second region B may be curved. That is, although FIG. 1 illustrates a portion of the upper surface of the second region B having an inclined surface, the present embodiment is not limited thereto, and one region of the upper surface of the second region B may be curved. When the upper surface of the second region B is curved over a wide region, the second region B may include a bent region.

With respect to a user's viewpoint, when a distance from which light is transmitted at a position corresponding to the second region B is greater than a distance from which light is transmitted in the first region F, lateral visibility may be reduced. However, according to the present embodiment, a display device having a uniform image quality characteristic may be implemented by adjusting the concentration of the second optical functional particles 4300 in the second region B to be higher than the concentration of the first optical functional particles 4100 in the first region F, thereby improving lateral visibility. Accordingly, the display device 1000 according to the present embodiment may have increased flexibility and improved lateral visibility.

Figure 3:
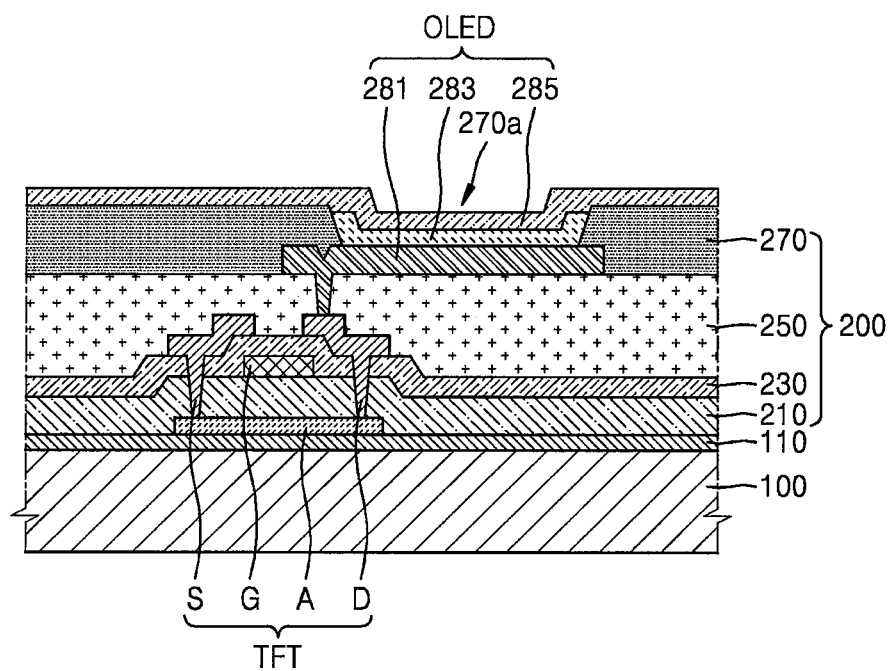
FIG. 3 is a cross-sectional view illustrating a portion of a display device according to another exemplary embodiment.

FIG. 3 is a cross-sectional view illustrating a portion of a display device according to another exemplary embodiment. Referring to FIG. 3, the display portion 200 includes a thin film transistor (TFT) and an OLED.

A buffer layer 110 may be on an upper portion of a substrate 100, and may prevent diffusion of impurity ions, may prevent penetration of moisture or air, and may serve as a barrier layer and/or a blocking layer for planarizing a surface.

A TFT may be formed at an upper portion of the buffer layer 110. Hereinafter, a top gate-type TFT, in which an active layer A, a gate electrode G, a source electrode S, and a drain electrode D are sequentially formed, is illustrated. However, the present embodiment is not limited thereto, and various types of TFTs such as a bottom gate-type TFT, etc. may be adopted.

The active layer A may include a silicon-based semiconductor material, an oxide, and/or an organic material. Impurities may be selectively injected to at least one region of the active layer A. The gate electrode G may overlap the active layer A, and may include various materials having excellent conductivity.

A gate insulating layer 210 may be formed between the gate electrode G and the active layer A to insulate the gate electrode G from the active layer A. The gate insulating layer 210 may include a single layer or multiple layers of various insulating materials, such as a silicon oxide, a silicon nitride, etc.

An interlayer insulating layer 230 may be on the gate electrode G, and may include a metallic oxide, a metallic nitride, etc.

The source electrode S and the drain electrode D may be located on an upper portion of the interlayer insulating layer 230, and may include various conductive materials. The source electrode S and the drain electrode D may each be connected with a respective region of the active layer A.

A passivation layer 250 is on the source electrode S and on the drain electrode D, and may protect the TFT. In other embodiments, the upper surface of the passivation layer 250 may be planarized, or may have a structure including a single layer or multiple layers that include an inorganic material, an organic material, and/or an organic/inorganic compound.

As illustrated in FIG. 3, the OLED is located on an upper portion of the passivation layer 250. The OLED may include a first electrode 281, an interlayer 283 including an organic emission layer, and a second electrode 285. The display device 1000 may have a plurality of pixels or sub-pixels, and FIG. 3 may illustrate one region of one pixel or of one sub-pixel.

The first electrode 281 may be on the passivation layer 250, and may be electrically connected with one of the source electrode S and the drain electrode D. In another exemplary embodiment, the first electrode 281 may be patterned, for example, patterned for every pixel. The display device 1000 may further include a pixel defining layer 270, which may include an opening 270a that exposes the first electrode 281.

The interlayer 283 may be formed to correspond to the opening 270a, and may be electrically connected with the first electrode 281. The second electrode 285 may be electrically connected to the interlayer 283, and may be formed over all pixels (e.g., as a common electrode).

Figure 4:
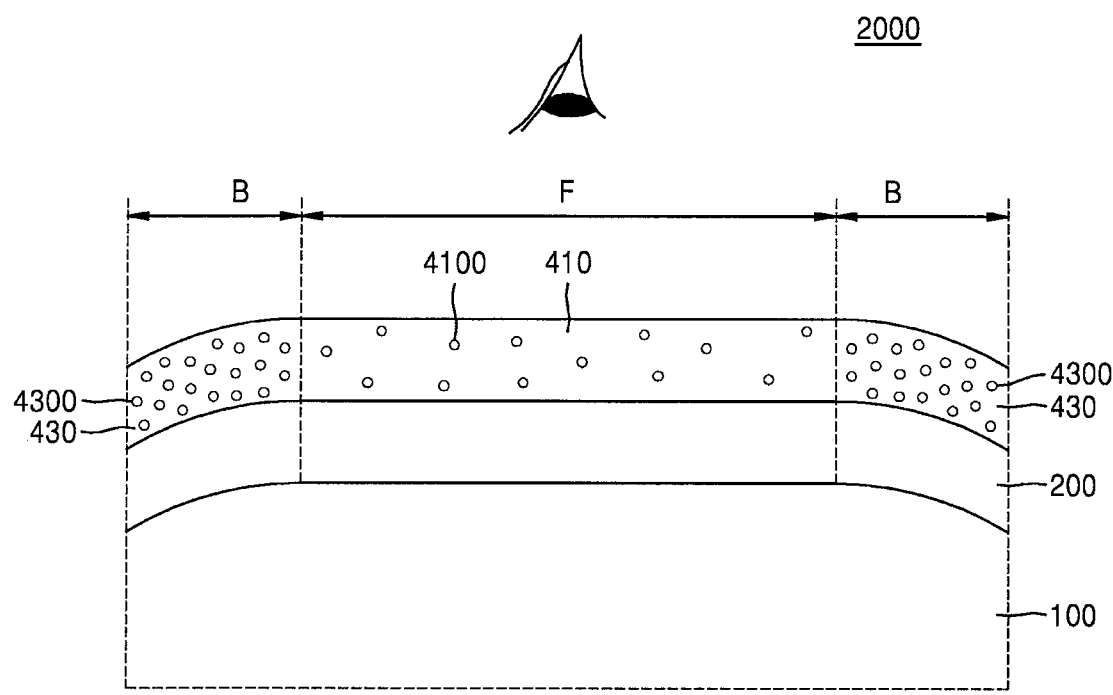
FIG. 4 is a cross-sectional view illustrating a display device according to another exemplary embodiment.

FIG. 4 is a cross-sectional view illustrating a display device 2000 according to another exemplary embodiment. In FIG. 4, like reference numerals used for FIGS. 1 to 3 represent like members, and repeated descriptions of the like members are omitted.

As illustrated in FIG. 4, in the display device 2000 according to the present embodiment, the second regions B may be on both sides of the first region F, with the first region F being located therebetween. That is, the first region F is formed in the central region of the display device 2000, and the second regions B may each be on a respective side of the first region F. The second regions B may be formed such that an upper surface of at least a portion of each second region B includes an inclined surface. In another exemplary embodiment, as illustrated in FIG. 4, the upper surface of each of the second regions B may be formed such that one region of the upper surface of each of the second regions B is curved. Also, in another exemplary embodiment, the entire upper surface of the second region B may be curved, so that the second region B may include a bent region.

The first base layer 410 may correspond to the first region F, and the second base layer 430 may be formed at a position corresponding to the second region B. The first base layer 410 and the second base layer 430 may include the same or different material, and/or may be integrally formed with each other. That is, in the display device 2000 according to the present embodiment illustrated in FIG. 4, the first base layer 410 and the second base layers 430 at both sides of the first base layer 410 may be integrally connected and formed. The first base layer 410 and the second base layers 430 correspond to the first region F and the second regions B, respectively.

The first base layer 410 and the second base layer 430 in the display device 2000 according to the present embodiment may respectively include the first optical functional particles 4100 and the second optical functional particles 4300 therein, and the concentration of the second optical functional particles 4300 may be higher than the concentration of the first optical functional particles 4100.

As described above, because the first base layer 410 and the second base layer 430 of the display device 2000 are formed by the ink-jet process, the concentration and/or the size of the first optical functional particles 4100 and the second optical functional particles 4300 may be adjusted/differently designed. The concentrations of the first optical functional particles 4100 and the second optical functional particles 4300 may be made different to improve a viewing angle with respect to the second region B, which includes a curved surface.

The second regions B of the display device 2000 according to the present embodiment are at both sides of the first region F, and are curved or bent, so that a transmittance thickness of the second base layer 430 formed at a position corresponding to the second region B may increase. That is, because the transmittance thickness of the second base layer 4300 increases, and because the second optical functional particles 4300 of high concentration are included, a color reproduction range increases, and lateral visibility may improve. Furthermore, as illustrated in FIGS. 1 and 4, when the concentration of the second optical functional particles 4300 is higher than that of the first optical functional particles 4100 due to differences in concentration, a color reproduction range shown at the second region B (e.g., the lateral side of the display device 2000) may be increased. That is, because the concentration of the second optical functional particles 4300 is higher in the second region B, which may include a curved surface or a bent region, lateral visibility white angular dependency (WAD) may improve.

Figure 5:
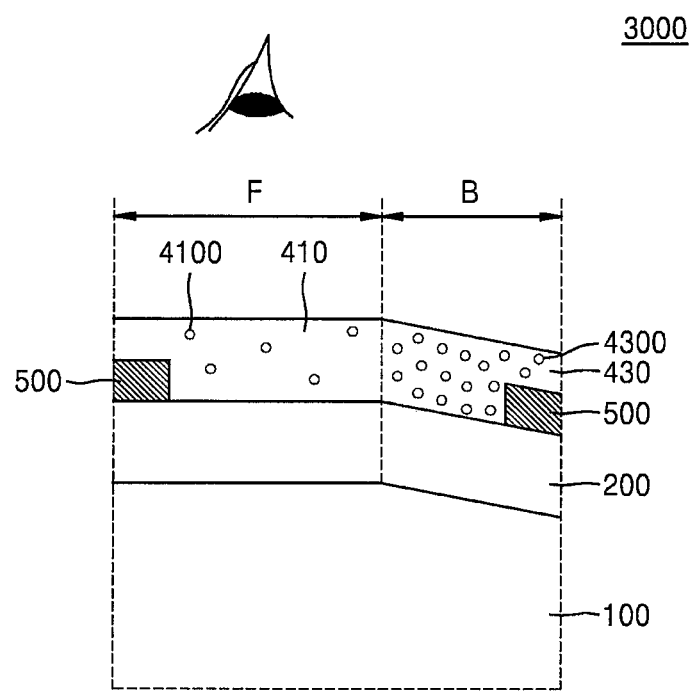
FIG. 5 is a cross-sectional view illustrating a display device according to another exemplary embodiment.

FIG. 5 is a cross-sectional view illustrating a display device 3000 according to another exemplary embodiment. In FIG. 5, like reference numerals used for FIGS. 1 to 3 represent like members, and repeated descriptions of the like members are omitted for conciseness.

The display device 3000 according to the present embodiment may further include an optical reflection reduction member 500 formed adjacent the first base layer 410 or the second base layer 430. The optical reflection reduction member 500 is configured to reduce contrast by reducing reflection of external light, and may include a black matrix-forming material (e.g., may be formed as a black matrix) that absorbs light of a wavelength that is in a visible light region, although the optical reflection reduction member 500 is not limited to the black matrix.

In another exemplary embodiment, the optical reflection reduction member 500 may be covered with the first base layer 410 and the second base layer 430, as illustrated in FIG. 5, although the formed position or shape are not limited thereto. In another exemplary embodiment, two optical reflection reduction members 500 may be spaced from each other, and may be covered with the first base layer 410 and the second base layer 430, as illustrated in FIG. 5, although the position or shape are not particularly limited, and the optical reflection reduction members 500 may be patterned such that a plurality of optical reflection reduction members 500 are spaced from each other.

The display device 3000 according to the present embodiment reduces or prevents external light being reflected by the electrode of the OLED, by a wiring layer, etc. in the lower portion by forming the optical reflection reduction members 500. That is, the reduced reflection represents a reduction in external light that is reflected by the electrode of the OLED, by a wiring layer, or by a portion of the substrate 100 under the OLED.

Light generated from the display portion 200 of the display device 3000 according to the present embodiment may be emitted via a space between the optical reflection reduction members 500 spaced apart from each other.

Figure 6:
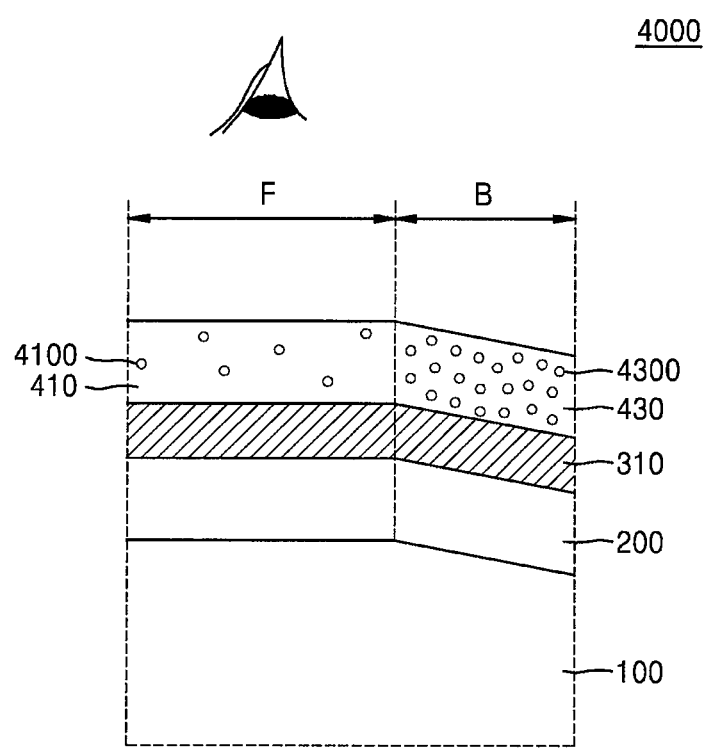
FIG. 6 is a cross-sectional view illustrating a display device according to another exemplary embodiment.

FIG. 6 is a cross-sectional view illustrating a display device 4000 according to another exemplary embodiment. In FIG. 6, like reference numerals used for FIG. 1 represent like members, and repeated descriptions of the like members are omitted for conciseness.

The display device 4000 according to the present embodiment may further include a first insulating layer 310 between the display portion 200 and the first base layer 410 or between the display portion 200 and the second base layer 430. The first insulating layer 310 may block penetration of oxygen or moisture. In another exemplary embodiment, the first insulating layer 310 may be a single layer or may be a stacked layer including a metallic oxide and/or a metallic nitride. The inorganic layers may include one of SiNx, $Al_2O_3$, $SiO_2$, and/or $TiO_2$.

Figure 7:
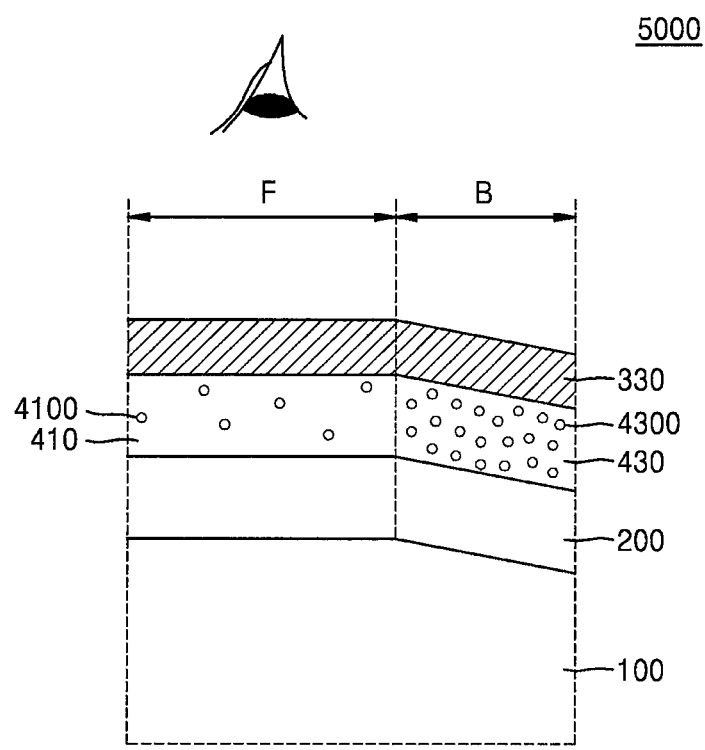
FIG. 7 is a cross-sectional view illustrating a display device according to another exemplary embodiment.

FIG. 7 is a cross-sectional view illustrating a display device 5000 according to another exemplary embodiment. In FIG. 7, like reference numerals used for FIG. 6 represent like members, and repeated descriptions of the like members are omitted for conciseness.

The display device 5000 according to the present embodiment may further include a second insulating layer 330 on an upper portion of the first base layer 410 and/or on an upper portion of the second base layer 430. The second insulating layer 330 may block penetration of oxygen or moisture. In another exemplary embodiment, the second insulating layer 330 may be a single layer or may be a stacked layer including a metallic oxide and/or a metallic nitride. The inorganic layers may include one of SiNx, $Al_2O_3$, $SiO_2$, and/or $TiO_2$.

Figure 8:
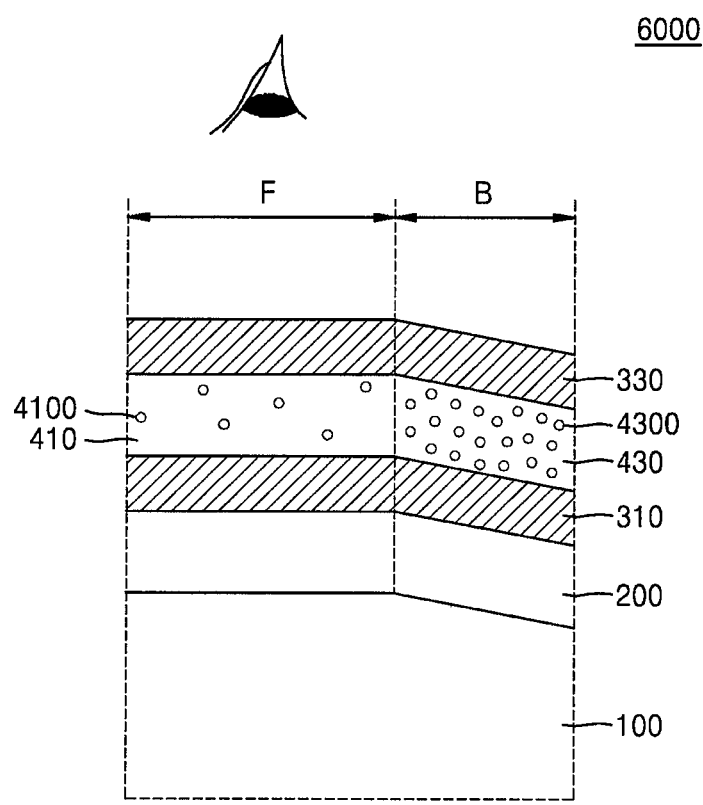
FIG. 8 is a cross-sectional view illustrating a display device according to another exemplary embodiment.

FIG. 8 is a cross-sectional view illustrating a display device 6000 according to another exemplary embodiment. In FIG. 8, like reference numerals used for FIGS. 6 and 7 represent like members, and repeated descriptions of the like members are omitted for conciseness. The display device 6000 according to the present embodiment may further include the first insulating layer 310 between the display portion 200 and the first base layer 410 and/or between the display portion 200 and the second base layer 430, and the second insulating layer 330 on the upper portion of the first base layer 410 and/or on the second base layer 430.

The first insulating layer 310 and the second insulating layer 330 may block penetration of oxygen or moisture. In another exemplary embodiment, the first insulating layer 310 and/or the second insulating layer 330 may be a single layer or may be a stacked layer including a metallic oxide and/or a metallic nitride. The inorganic layers may include one of SiNx, $Al_2O_3$, $SiO_2$, and/or $TiO_2$.

Figure 9:
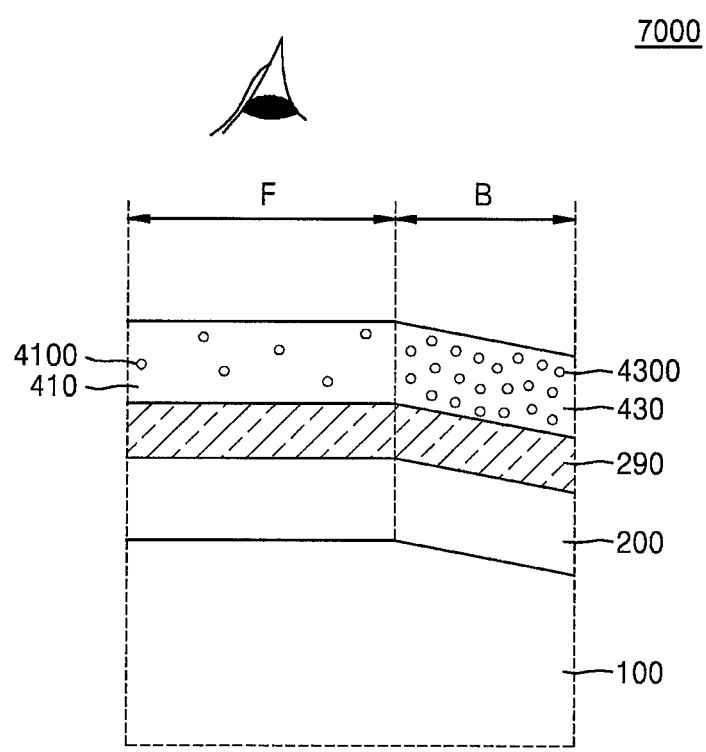
FIG. 9 is a cross-sectional view illustrating a display device according to another exemplary embodiment.
Figure 10:
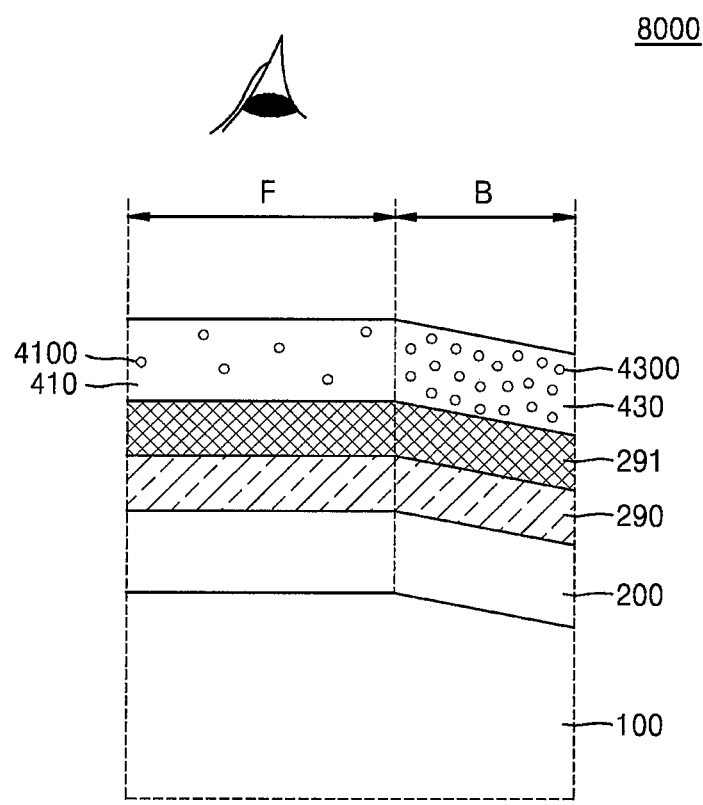
FIG. 10 is a cross-sectional view illustrating a display device according to another exemplary embodiment.

FIG. 9 is a cross-sectional view illustrating a display device 7000 according to another exemplary embodiment, and FIG. 10 is a cross-sectional view illustrating a display device 8000 according to another exemplary embodiment. In FIGS. 9 and 10, like reference numerals used for FIG. 1 represent like members, and repeated descriptions of the like members are omitted for conciseness.

The display device 7000 according to the present embodiment illustrated in FIG. 9 may further include a capping layer 290 between the display portion 200 and the first base layer 410 and/or between the display portion 200 and the second base layer 430, and the capping layer 290 may provide protection of the display portion 200 from an external environment.

Also, the display device 8000 according to the exemplary embodiment illustrated in FIG. 10 may further include, in addition to the capping layer 290, a protection layer 291 between the capping layer 290 and the first base layer 410 and/or between the capping layer 290 and the second base layer 430. Because the display device 8000 according to the present embodiment further includes the capping layer 290 and the protection layer 291, the display device 8000 may efficiently protect the display portion 200 from harmful factors such as external oxygen, moisture, etc. The protection layer 291 may include LiF and may be deposited by using various deposition methods such as evaporation, etc. to protect the capping layer 290, the OLED, and other elements/members located in a lower portion of the display device 8000.

Figure 11:
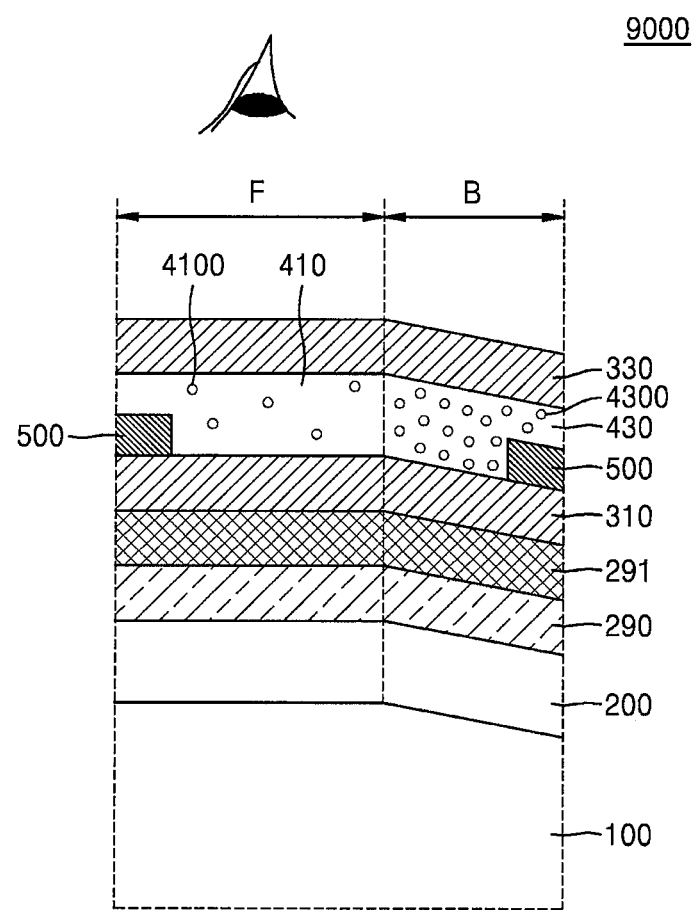
FIG. 11 is a cross-sectional view illustrating a display device according to another exemplary embodiment.

FIG. 11 is a cross-sectional view illustrating a display device 9000 according to another exemplary embodiment. In FIG. 11, like reference numerals used for FIGS. 1 to 10 represent like members, and repeated descriptions of the like members are omitted for conciseness.

The display device 9000 according to the present embodiment may include the substrate 100, the display portion 200 on the substrate 100, the capping layer 290 on an upper portion of the display portion 200 for protecting the display portion 200, and the protection layer 291 on the upper portion of the capping layer 290 for protecting the display portion 200 and the capping layer 290.

The display device 9000 may also include the first insulating layer 310 on an upper portion of the protection layer 291 for blocking penetration of external oxygen or moisture, the first base layer 410 on an upper portion of the first insulating layer 310, the first base layer 410 including the first optical functional particles 4100 and corresponding to the first region F including the central portion, and the second base layer 430 on the upper portion of the first insulating layer 310, the second base layer 430 including the second optical functional particles 4300 and corresponding to the second region B including an inclined portion.

The display device 9000 may also include the optical reflection reduction member 500 adjacent the first base layer 410 and/or adjacent the second base layer 430, and may also include the second insulating layer 330 on the upper portion of the first base layer 410 or on the upper portion of the second base layer 430 for blocking penetration of external oxygen or moisture.

Figure 12:
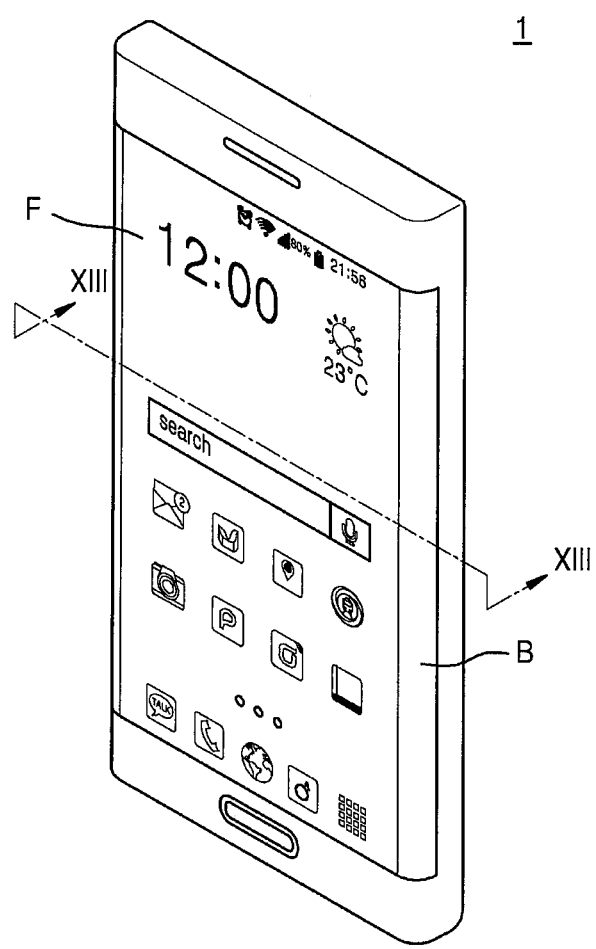
FIG. 12 is a perspective view illustrating a display device according to another exemplary embodiment.

FIG. 12 is a perspective view illustrating an exemplary embodiment of a display device 1 according to another exemplary embodiment. Although a mobile terminal is illustrated as the display device 1 according to the present embodiment in FIG. 12, the display device 1 is not limited to mobile terminals, and may be used for various display devices. In the display device 1 according to the present embodiment, the first region F may be formed in the central region, and the second regions B may be formed at two respective sides of the first region F. In another exemplary embodiment, the second region B may include a bent region, as illustrated in FIG. 12.

Figure 13:
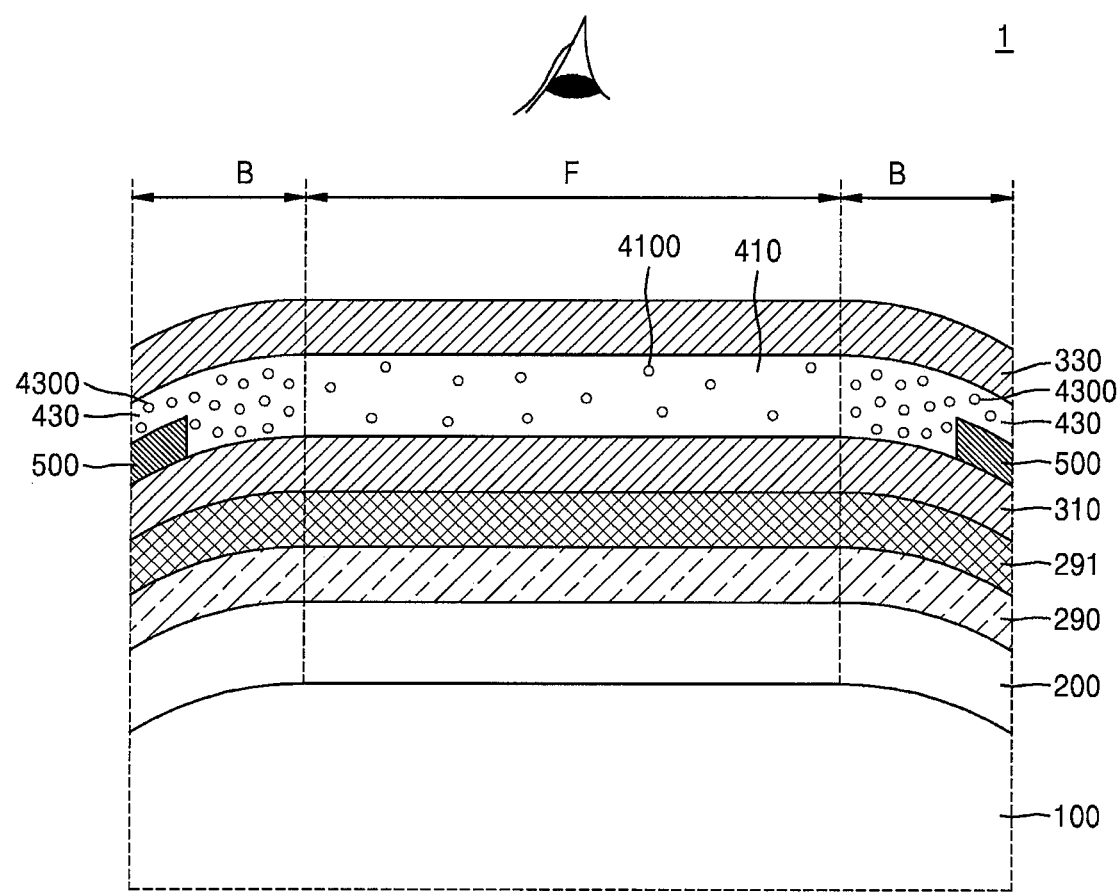
FIG. 13 is a cross-sectional view taken along the line XIII-XIII of FIG. 12.

FIG. 13 is a cross-sectional view taken along the line XIII-XIII of FIG. 12. In FIG. 13, like reference numerals used for FIGS. 1 to 11 represent like members, and repeated descriptions of the like members are omitted for conciseness.

In the display device 1 according to the present embodiment, like the exemplary embodiment illustrated in FIG. 4, one of each of the second regions B may be on a respective side of the first region F with the first region F located therebetween. That is, the first region F may be formed at the central region, and the second regions B may be respectively on both sides of the first region F.

As illustrated in FIG. 13, in the display device 1 according to the present embodiment, the optical reflection reduction member 500 may be formed adjacent the second region B. For example, two optical reflection reduction members 500 may be spaced from each other by a given distance and may be covered with the second base layer 430. However, the number, position, and shape of optical reflection reduction members 500 are not particularly limited. That is, as long as a plurality of optical reflection reduction members 500 are spaced from each other and are adjacent the first base layer 410 and/or the second base layer 430, the optical reflection reduction members 500 may be designed without limitation of their number and position.

In the display device 1 according to the present embodiment, the first insulating layer 310, the first base layer 410, the second base layer 430, and the second insulating layer 330 may be on the upper portion of the display portion 200 to serve as an encapsulation portion that seals the display portion 200. That is, because the encapsulation portion may be provided as a thin film encapsulation, which may include a plurality of alternately stacked inorganic layers and organic layers, the first insulating layer 310 and the second insulating layer 330 of the display device 1 according to the present embodiment may serve as the inorganic layer, and the first base layer 410 and the second base layer 430 may serve as the organic layer. Accordingly, the first insulating layer 310, the first base layer 410, the second base layer 430, and the second insulating layer 330 may serve as the encapsulation portion that protects the display portion 200 from foreign substances, such as external oxygen, moisture, etc., and may also improve emission efficiency of light generated from the display portion 200.

Also, because the concentration of the second optical functional particles 4300 in the second base layer 430 at the second region B having an inclined portion is higher than the concentration of the first optical functional particles 4100, lateral visibility white angular dependency (WAD) of the display device 1 is improved.

Hereinafter, a method of manufacturing a display device according to an exemplary embodiment is described in detail. The display device according to the exemplary embodiment may include the first region F that generates visible light so that a user may recognize, and the second region B having a region that at least not overlap the first region F.

The method of manufacturing the display device according to an exemplary embodiment may include forming the display portion 200 on the substrate 100, forming the first base layer 410 corresponding to the first region F on the display portion 200, forming a plurality of first optical functional particles 4100 of chromatic color with a first concentration inside the first base layer 410, forming the second base layer 430 corresponding to the second region B on the display portion 200, and forming a plurality of second optical functional particles 4300 of chromatic color with a second concentration, which is higher than the first concentration, inside the second base layer 430.

The forming of the display portion 200 may include forming the active layer A, the gate insulating layer 210, and the gate electrode G.

The active layer A may include a semiconductor including amorphous silicon or crystalline silicon, and may be deposited by using various deposition methods. The crystalline silicon may be formed by crystallizing the amorphous silicon by using various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc. The active layer A may be patterned via a photolithography process.

The gate insulating layer 210 on the upper portion of the active layer A may be formed by using various deposition methods such as sputtering, chemical vapor deposition (CVD), or plasma-enhanced chemical vapor deposition (PECVD), etc.

The gate electrode G insulated from the active layer A by the gate insulating layer 210 may be on the upper portion of the gate insulating layer 210, and the interlayer 230 may be on the upper portion of the gate electrode G. The interlayer 230 may be formed by using various deposition methods such as sputtering, chemical vapor deposition (CVD), or plasma-enhanced chemical vapor deposition (PECVD), etc.

Forming the first base layer 410 and the first optical functional particles 4100 inside the first base layer 410 may include mixing a material that forms the first base layer 410 and the first optical functional particles 4100, and disposing the mixed material on the display portion 200. The first base layer 410 may include an insulating material, and the first optical functional particles 4100 may include pigment, although materials that form the first base layer 410 and the first optical functional particles 4100 are not particularly limited.

The material that forms the mixed first base layer 410 and the first optical functional particles 4100 may be formed on the display portion 200 by using the ink-jet process as described above. Because the first optical functional particles 4100 are deposited using an ink-jet process, the position and concentration of the first optical functional particles 4100 may be adjusted.

Forming the second base layer 430 and the second optical functional particles 4300 inside the second base layer 430 may include mixing a material that forms the second base layer 430 and the second optical functional particles 4300, and disposing the mixed material on the display portion 200. The second base layer 430 may include an insulating material, and the second optical functional particles 4300 may include a pigment, although materials that form the second base layer 430 and the second optical functional particles 4300 are not particularly limited.

Like the first base layer 410 and the first optical functional particles 4100, the mixed material that forms the second base layer 430 and second optical functional particles 4300 may be deposited on the display portion 200 by using the ink-jet process. Because the second optical functional particles 4300 are deposited by using an ink-jet process, the position and concentration of the second optical functional particles 4300 may be adjusted.

The method of manufacturing the display device according to an exemplary embodiment may further include bending the display device away from an intended vantage point of a user. However, the direction in which the display device is bent is not limited thereto, and as another exemplary embodiment, the method may include bending the display device toward the user's intended vantage point. A region bent by the above operation may be included in the second region B, and the first region F may include the central region that is recognized by the user.

The second region B may be farther from the central region of the display device than the first region F. Also, because the second region B includes the bent region, the upper surface of the second region B may be spaced from an extension line of the upper surface of the first region F.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A display device configured to display a video image via a plurality of pixels, and having a first region comprising a plurality of first pixels and a second region comprising a plurality of second pixels, the display device comprising:
    a substrate;
    a display portion on the substrate;
    a base layer on the display portion, the base layer comprising a first base layer corresponding to the first region and a second base layer corresponding to the second region;
    a plurality of first optical functional particles inside the first base layer at a first concentration and having chromatic color;
    a plurality of second optical functional particles inside the second base layer at a second concentration that is higher than the first concentration and having chromatic color;
    a first insulating layer between the display portion and the base layer;
    a second insulating layer at an upper portion of the base layer; and
    an optical reflection reduction member adjoining the second base layer such that the second base layer covers a top surface of the optical reflection reduction member,
    wherein a color of one of the second optical functional particles is the same as a color of one of the first optical functional particles, and
    wherein the second region corresponds to a bent or curved region comprising the plurality of second pixels where all of the display portion, the second base layer, the first insulating layer, and the second insulating layer are bent or curved with respect to a corresponding edge of the first region comprising the plurality of first pixels, such that at least one surface of the substrate is curved, and such that a first direction that is normal to the first region forms an angle with a second direction that is normal to the second region.

2. The display device of claim 1, wherein an upper surface of the second region is spaced from an extension line of an upper surface of the first region.

3. The display device of claim 1, wherein at least a portion of an upper surface of the first region is flat.

4. The display device of claim 1, wherein at least a portion of an upper surface of the second region is inclined or curved.

5. The display device of claim 1, wherein the second region contacts the first region.

6. The display device of claim 1, wherein the second region is at both sides of the first region with the first region therebetween.

7. The display device of claim 1, wherein at least one of the first base layer and the second base layer comprises an insulating material.

8. The display device of claim 1, wherein the first base layer and the second base layer are integrally formed with each other and comprise a same material.

9. The display device of claim 1, wherein the first optical functional particles or the second optical functional particles comprise a pigment.

10. The display device of claim 1, wherein the optical reflection reduction member comprises a black matrix-forming material.

11. The display device of claim 1, wherein the optical reflection reduction member is patterned as a plurality of shapes spaced from each other, and
    wherein the display portion is configured to generate light emitted via a space between the plurality of shapes of the optical reflection reduction member.

12. The display device of claim 1, wherein the substrate has flexibility.

13. The display device of claim 1, wherein the display portion comprises a first electrode, a second electrode, and an interlayer comprising an emission layer between the first electrode and the second electrode.

14. The display device of claim 1, further comprising a capping layer between the display portion and at least one of the first base layer and the second base layer.

15. The display device of claim 14, further comprising a protection layer between the capping layer and at least one of the first base layer and the second base layer.

* * * * *